United States Patent
Sumant et al.

(10) Patent No.: US 9,484,474 B1
(45) Date of Patent: Nov. 1, 2016

(54) ULTRANANOCRYSTALLINE DIAMOND CONTACTS FOR ELECTRONIC DEVICES

(71) Applicant: UChicago Argonne, LLC, Chicago, IL (US)

(72) Inventors: Anirudha V. Sumant, Plainfield, IL (US); John Smedley, Shirley, NY (US); Erik Muller, South Setauket, NY (US)

(73) Assignees: UChicago Argonne, LLC, Chicago, IL (US); Brookhaven Science Associates, LLC, Upton, NY (US); The Research Foundation for the State University of New York, Albany, NY (US)

( * ) Notice: Subject to any disclaimer, the term of this patent is extended or adjusted under 35 U.S.C. 154(b) by 0 days.

(21) Appl. No.: 14/790,995

(22) Filed: Jul. 2, 2015

(51) Int. Cl.
- *H01L 31/18* (2006.01)
- *H01L 31/0224* (2006.01)
- *H01L 31/028* (2006.01)
- *H01L 31/115* (2006.01)

(52) U.S. Cl.
CPC ..... *H01L 31/022408* (2013.01); *H01L 31/028* (2013.01); *H01L 31/115* (2013.01); *H01L 31/1804* (2013.01)

(58) Field of Classification Search
CPC ............... H01L 31/1804; H01L 21/02527; H01L 21/0259; H01L 21/02573–21/02579; H01L 31/028; H01L 31/0288; H01L 31/115; H01L 31/022408
See application file for complete search history.

(56) References Cited

U.S. PATENT DOCUMENTS

| | | | |
|---|---|---|---|
| 5,717,214 A | 2/1998 | Kitamura et al. | |
| 6,340,393 B1 * | 1/2002 | Yoshida | C23C 14/0611 117/104 |
| 7,556,982 B2 * | 7/2009 | Carlisle | C23C 16/274 438/105 |
| 8,354,290 B2 | 1/2013 | Sumant et al. | |
| 8,420,043 B2 * | 4/2013 | Gamo | C23C 16/27 136/252 |
| 9,108,888 B2 | 8/2015 | Neogi et al. | |
| 2002/0041154 A1 | 4/2002 | Tomasetti et al. | |
| 2003/0001498 A1 | 1/2003 | Niigaki et al. | |
| 2004/0129202 A1 | 7/2004 | Gruen et al. | |
| 2004/0221795 A1 | 11/2004 | Scarsbrook et al. | |
| 2006/0060864 A1 | 3/2006 | Gerbi | |
| 2006/0131588 A1 * | 6/2006 | Gruen | C23C 16/274 257/77 |
| 2007/0057261 A1 | 3/2007 | Jeong et al. | |
| 2007/0220959 A1 | 9/2007 | Sumant et al. | |
| 2009/0124025 A1 | 5/2009 | Hamilton et al. | |
| 2010/0051964 A1 | 3/2010 | Lin et al. | |
| 2010/0052112 A1 * | 3/2010 | Rogers | B81B 7/0093 257/625 |

(Continued)

OTHER PUBLICATIONS

Gaowei, M. "Responsivity Study of Diamond X-Ray Monitors with nUNCD Contact" Proc. of IPAC 2015, Jun. 2015 pp. 1273-1275.*

(Continued)

*Primary Examiner* — Matthew Landau
*Assistant Examiner* — Grant Withers
(74) *Attorney, Agent, or Firm* — Foley & Lardner LLP

(57) ABSTRACT

A method of forming electrical contacts on a diamond substrate comprises producing a plasma ball using a microwave plasma source in the presence of a mixture of gases. The mixture of gases include a source of a p-type or an n-type dopant. The plasma ball is disposed at a first distance from the diamond substrate. The diamond substrate is maintained at a first temperature. The plasma ball is maintained at the first distance from the diamond substrate for a first time, and a UNCD film, which is doped with at least one of a p-type dopant and an n-type dopant, is disposed on the diamond substrate. The doped UNCD film is patterned to define UNCD electrical contacts on the diamond substrate.

9 Claims, 8 Drawing Sheets

(56) References Cited

U.S. PATENT DOCUMENTS

| | | |
|---|---|---|
| 2012/0312353 A1 | 12/2012 | Kusterer et al. |
| 2013/0026492 A1 | 1/2013 | Khan |
| 2013/0082241 A1 | 4/2013 | Kub et al. |
| 2013/0145857 A1 | 6/2013 | Bryant et al. |
| 2013/0320295 A1 | 12/2013 | Rao et al. |
| 2013/0333094 A1 | 12/2013 | Rogers et al. |

OTHER PUBLICATIONS

Aslam, et al., "Piezorsistivity in vapor-deposited diamond films," Applied Physics Letters, vol. 60, Issue 23, Jun. 8, 1992, 3 pages.

Baryshev, et al., "Planar ultrananocrystalline diamond field emitter in accelerator radio frequency electron injector: Performance metrics," Applied Physics Letters, vol. 105, No. 203505 Nov. 18, 2014, pp. 203505-1-203505-5.

Butler, et al., "The CVD of Nanodiamond Materials," Chemical Vapor Deposition, vol. 14, Aug. 15, 2008, 16 pages.

Dai, et al., "Optically Transparent Diamond Electrode for Use in IR Transmission Spectroelectrochemical Measurements", Analytical Chemistry, vol. 79, No. 19, Oct. 1, 2007, 8 pages.

Fischetti, et al., Band structure, deformation potentials, and carrier mobility in strained Si, Ge, and SiGe alloys, Journal of Applied Physics, vol. 80, No. 4, Aug. 15, 1996, 19 pages.

Goyal, et al., "Direct Low-Temperature Integration of Nanocrystalline Diamond with GaN Substrates for Improved Thermal Management of High-Power Electronics", Advanced Functional Materials Journal, Feb. 1, 2012, 22, 1525-1530.

Grimes, Jacob T., "A Prototype Diamond Amplified Photocathode", Master of Science Thesis, Stony Brook University, May 2007, pp. ii-102.

Gruen, et al., "Configurational, electronic entropies and the thermoelectric properties of nanocarbon ensembles," Applied Physics Letters, vol. 92, Issue 14, No. 143118, Apr. 11, 2008, 3 pages.

He, et al., "Giant piezoresistance effect in silicon nanowires," Nature Nanotechnology, vol. 1, Oct. 2006, 5 pages.

Ieong, et al., "Silicon Device Scaling to the Sub-10-nm Regime," Science, vol. 306, Dec. 17, 2004, 4 pages.

Perez, et al., "High quantum efficiency ultrananocrystalline diamond photocathode for photoinjector applications," Applied Physics Letters, vol. 105 Sep. 22, 2014, pp. 123103-1-123103-4.

Rameau, et al., "Properties of Hydrogen Terminated Diamond As a Photocathode", Physical Review Letters, Abstract, vol. 106, Issue 137602, Mar. 30, 2011, 4 pages.

Stotter et al., "Optical and Electrochemical Properties of Optically Transparent, Boron-Doped Diamond Thin Films Deposited on Quartz" Analytical Chemistry, vol. 74, No. 23, Dec. 1, 2002, 7 pages.

Sumant,et al., "High Quantum Efficiency Photocathodes Based on Ultrananocrystalline Diamond Operating Between 250 nm and Visible Blue", Slide Presentation, by Argonne and U.S. Department of Energy, Nov. 24, 2014, p. 1-7.

Tremsin & Siegmund, "Polycrystalline diamond films as prospective UV photocathodes," Proceedings SPIE, vol. 4139, Dec. 18, 2000, pp. 1-9.

US Notice of Allowance for U.S. Appl. No. 14/594,949, Mailed Apr. 1, 2016, 10 pages.

Werner, et al., "Review on diamond based piezoresistive sensors." Industrial Electronics Jul. 1998, IEEE International Symposium, vol. 1, 6 pages.

Auciello, et al, Are Diamonds a MEMS' Best Friend?, IEEE Microwave Magazine, Dec. 2007, 15 pages.

Gerbi, et al., Electrical Contacts to ultrananocrystalline diamond, Applied Physics Leeters, vol. 83, No. 10, Sep. 8, 2003, 3 pages.

Abdel-Motaleb, Ibrahim M., Diamond Technology: An Overview, IEEE, Oct. 2006, 4 pages.

American Institute of Physics, Scientists Carve Nanowire Out of Ultrananosrystalline Diamond Thin Films, Nov. 4, 2011, 1 page.

Kulha et al., Design and Fabrication of Piezoresistive Strain Gauges Based on Nanocrystalline Diamond Layers, 2011, 4 pages.

Wang et al., Piezoresistivity of Polycrystalline P-type Diamond Films of Various Doping Levels at Different Temperatures, Jul. 15, 1997, 5 pages.

Search Report and Written Opinion for International Application No. PCT/US2016/013708, mail date Jul. 28, 2016, 11 pages.

Notice of Allowance on U.S. Appl. No. 14/594,949, mailed Jul. 13, 2016, 3 pages.

Notice of Allowance on U.S. Appl. No. 14/601,908, mailed May 9, 2016, 7 pages.

\* cited by examiner

ULTRANANOCRYSTALLINE DIAMOND CONTACTS FOR ELECTRONIC DEVICES

The United States Government claims certain rights in this invention pursuant to Contract Nos. DE-AC02-98CH10886 and DE-SC0012704 awarded by the U.S. Department of Energy to Brookhaven Science Associates, LLC, Contract No. W-31-109-ENG-38 between the United States Government and the University of Chicago and/or pursuant to DE-AC02-06CH11357 between the United States Government and UChicago Argonne, LLC representing Argonne National Laboratory.

TECHNICAL FIELD

The present disclosure relates generally to the field of electronic devices and X-ray monitoring devices.

BACKGROUND

The progress of solid state devices has allowed fabrication of micro and nano-scale electronic devices for a wide range of applications. Most conventional electronic devices are fabricated in silicon, germanium or some other semi-conductor material. Metallic electrical contacts are generally used to interface such micro and nano-scale electronic devices with macro electronics. The metallic contact pads are susceptible to corrosion so noble metals such as platinum and gold are often used to form the electrical contacts which increase the cost of such electronic devices.

X-ray monitors are a class of electronic devices that are used to monitor position of X-ray beams, flux and timing of X-ray beams. Such X-ray beams can be included in synchrotron radiation which is defined as an electromagnetic wave radiated in a direction tangent to an orbit of an electron having been accelerated by an electron accelerator. Synchrotron radiation can include light wavelengths ranging from visible light to hard X-rays and can be used to perform spectroscopy and diffraction experiments. To perform such experiments, the X-ray beam monitors are necessary to monitor and stabilize X-ray beams.

Conventional X-ray monitors are formed from semiconductor materials such as silicon and germanium. Such devices generally include a p-n junction formed in the semiconductor material. When X-ray beams are injected into the p-n junction, electron-hole pairs are generated which produce current. However, such semi-conductor devices have a smaller response speed due to small saturated velocity of carriers because of the electric properties of silicon or germanium. For example, silicon has a resistivity of $10^5$ Ohm-cm and germanium has low resistivity. Furthermore, such detectors produce excessive dark current.

In contrast, diamond is particularly attractive for fabricating X-ray monitors to measure flux, position and timing of monochromatic and white X-ray beam. Diamond, because of its low Z (atomic number), has lower absorption for X-rays, extreme resistance to corrosion and radiation damage, high thermal conductivity and the ability to operate at high temperatures with low leakage. A voltage is applied to an intrinsic region of such diamond based X-ray monitors which acts as an active element obviating the need for a p-n junction. This is because diamond has sufficiently high resistivity in its intrinsic region. Therefore, electron-hole pairs are generated in the entire region of the diamond through which X-ray beams pass.

Conventional diamond based X-ray monitors, however include metal electrical contacts. Since metals have high atomic number (Z), the metal electrical contacts absorb a significantly higher amount of X-rays relative to the diamond thereby, drastically reducing the efficiency of such diamond detectors.

SUMMARY

Embodiments described herein relate generally to electronic devices that include p-doped or n-doped ultrananocrystalline diamond (UNCD) electrical contacts and in particular to diamond X-ray monitors that include the p-doped or n-doped UNCD electrical contacts.

In some embodiments, a method of forming electrical contacts on a diamond substrate comprises producing a plasma ball using a microwave plasma source in the presence of a mixture of gases. The mixture of gases includes a source of a p-type or an n-type dopant. The plasma ball is disposed at a first distance from the diamond substrate. The diamond substrate is maintained at a first temperature. The plasma ball is maintained at the first distance from the diamond substrate for a first time, and a UNCD film, which is doped with at least one of a p-type dopant and an n-type dopant, is disposed on the diamond substrate. The doped UNCD film is patterned to define UNCD electrical contacts on the diamond substrate.

In other embodiments, a device comprises a diamond substrate which includes electronic circuitry disposed within the diamond substrate. At least one electrical contact is disposed on the diamond substrate. The at least one electrical contact includes a p-doped or an n-doped UNCD which is in electrical communication with the electronic circuitry.

In still another embodiment, an X-ray monitor comprises a diamond substrate having a surface. A plurality of electrical contacts are disposed on the surface. The plurality of electrical contacts include a p-doped or an n-doped UNCD and have an X-ray absorption of less than about 1%.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

Figure 1:
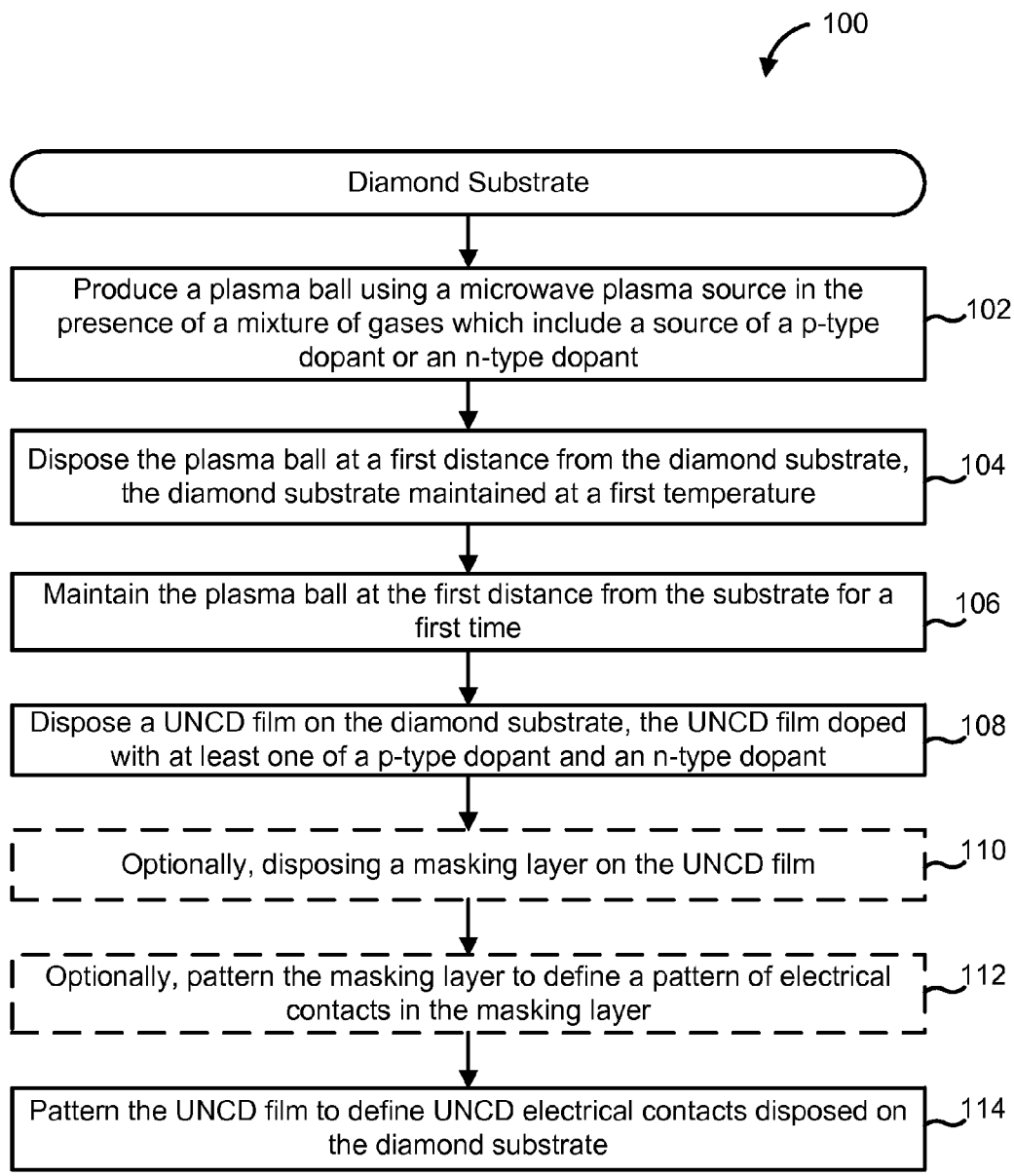
FIG. 1 is a schematic flow diagram of an exemplary method of forming p-doped or n-doped UNCD contacts on a diamond substrate according to an embodiment.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION OF VARIOUS EMBODIMENTS

Embodiments described herein relate generally to electronic devices that include p-doped or n-doped UNCD electrical contacts and in particular to diamond X-ray monitors that include the p-doped or n-doped UNCD electrical contacts.

Embodiments of the electronic devices that include the p-doped or n-doped UNCD electrical contacts described herein provide several benefits including, for example: (1) replacing metal contacts with p-doped (e.g., boron doped) or n-doped (e.g., nitrogen doped) UNCD electrical contacts; (2) having high chemical resistance, high electrical conductivity, high thermal conductivity and resistance to oxidation or otherwise corrosion even at high temperatures of up to about 800 degrees Celsius; (4) providing superior adhesion to diamond substrates used in X-ray monitors; (3) having a low atomic number which enables the doped UNCD electrical contacts to have an X-ray absorption of less than 1% thereby having minimal or no impact on the efficiency of the diamond X-ray monitor; and (5) having superior resistance to damage which can be caused by high flux X-rays relative to metal electrical contacts.

As used herein, the term "ultrananocrystalline diamond (UNCD)" refers to crystalline diamond that has a grain size in the range of 2 nm to 10 nm.

As used herein, the term "p-type dopant" refers to elements that can be incorporated into a semi-conductor such as silicon, germanium or UNCD to create a deficiency of valence electrons called "holes" in the semi-conductor, thereby greatly increasing the conductivity of the semi-conductor. Such p-type dopants can include, for example boron, aluminum or gallium or any other element that can create holes in the semi-conductor.

As used herein, the term "n-type dopant" refers to elements that can be incorporated into a semi-conductor such as silicon, germanium or UNCD to provide free electrons, thereby greatly increasing the conductivity of the semi-conductor. Such n-type dopants include phosphorous, antimony, arsenic, nitrogen or any other element that can contribute free electrons to the semi-conductor.

FIG. 1 is schematic flow diagram of an exemplary method 100 for fabricating a p-doped or an n-doped UNCD electrical contact on a diamond substrate. The diamond substrate can be included in an electronic device, for example an X-ray monitor for measuring flux, position and/or timing of monochromatic and white X-ray beam due to its low absorption, extreme resistance to corrosion and radiation damage, high thermal and electrical conductivity, and the ability to operate at high temperatures with low leakage.

The method 100 includes producing a plasma ball using a microwave plasma source in the presence of a mixture of gases which include a source of a p-type or an n-type dopant, at 102. The substrate can have any shape or size, for example a sheet, a block, a wafer, etc.

In one embodiment, the substrate can be disposed or positioned in an internal volume defined by a chamber (e.g., a microwave plasma chemical vapor deposition (MPCVD) chamber). The chamber can be sealed and any air or otherwise gases contained within the chamber can be evacuated by applying a vacuum to the chamber. The mixture of gases can be introduced into the internal volume of the chamber. In some embodiments, the mixture of gases can include argon, methane (e.g., about 0.1% to 1% by volume) and hydrogen (e.g., about 5% to about 10% by volume). In other embodiments, the mixture of gases can include methane and argon only. In still other embodiments, the mixture of gases can include other hydrocarbon sources such as acetylene in combination with other inert gases such as Neon, Helium, Xenon, etc.

As described herein, the mixture of gases also include a source of a p-type dopant or an n-type dopant. In one embodiment, the mixture of gases can include a source of boron such as a boron gas (e.g., $B_2H_6$ or trimethyl borate, or solid boron source such as boron powder) as the p-type dopant. In other embodiments, the mixture of gases can include a source of nitrogen as the n-type dopant. Nitrogen gas can be used as the source of nitrogen in the range of about 5% by volume to about 20% by volume. Furthermore, the p-type doping and n-type doping can also be achieved using other means such as ion-implantation.

The chamber can be maintained at a first pressure. In some embodiments, the first pressure can be in the range of about 40 Torr to about 70 Torr (e.g., about 40 Torr, 45 Torr, 50 Torr, 55 Torr, 60 Torr, 65 Torr or about 70 Torr inclusive of all ranges and values therebetween).

In some embodiments, a 915 MHz microwave plasma source can be used to produce the plasma ball. In other embodiments, any other microwave plasma source can be used, for example a 2.45 MHz microwave plasma source. In such embodiments, the plasma ball can have a diameter in the range of about 15 cms to about 30 cms, for example, about 16 cms, 18 cms, 20 cm, 22 cms, 24 cms, 26 cms, 28 cms or about 29 cms inclusive of all ranges and values therebetween. In some embodiments, the diameter of the plasma ball can be about 25 cms. Furthermore, any suitable power can be used to produce the plasma source, for example a power in the range of about 2 kW to about 3 kW (e.g., 2 kW, 2.2 kW, 2.4 kW, 2.6 kW, 2.8 kW or about 3 kW inclusive of all ranges and values therebetween).

The plasma ball is maintained at a first distance from the diamond substrate and maintained at a first temperature, at 104. For example, the diamond substrate can be disposed or positioned on a first microwave electrode maintained at the first temperature. In some embodiments, the first temperature can be in the range of about 200 degrees Celsius to about 450 degrees Celsius (e.g., about 220 degrees Celsius, 240 degrees Celsius, 260 degrees Celsius, 280 degrees Celsius, 300 degrees Celsius, 320 degrees Celsius, 340 degrees Celsius, 360 degrees Celsius, 380 degrees Celsius, 400 degrees Celsius, 420 degrees Celsius, or about 440 degrees Celsius, inclusive of all ranges and values therebetween). In other embodiments, the first temperature can be in the range of about 350 to about 900 degrees Celsius (e.g., 350 degrees Celsius, 400 degrees Celsius, 450 degrees Celsius, 500 degrees Celsius, 550 degrees Celsius, 600 degrees Celsius, 650 degrees Celsius, 700 degrees Celsius, 750 degrees Celsius, 800 degrees Celsius, 850 degrees Celsius or 900 degrees Celsius inclusive of all ranges and values therebetween). In particular embodiments, the first distance can be about 0.5 mm to about 5 mm (e.g., about 1 mm, 2 mm, 3 mm, or about 4 mm) inclusive of all ranges and values therebetween.

The plasma ball is maintained at the first distance from the diamond for a first time, at 106. In some embodiments, the first time can be about 20 minutes to about 60 minutes (e.g., about 25 minutes, 30 minutes, 35 minutes, 40 minutes, 45 minutes, 50 minutes, or about 55 minutes inclusive of all ranges and values therebetween).

A UNCD film is disposed (e.g., deposited, coated or grown) over the diamond substrate and is doped with at least one of a p-type or an type dopant, at 108. For example, the UNCD film can be a boron doped UNCD (B-UNCD) film having a concentration of the boron in the B-UNCD film can be in the range of about $1 \times 10^{21}$ atoms per cm$^3$ to about $9 \times 10^{21}$ atoms per cm$^3$ (e.g., about $2 \times 10^{21}$, $3 \times 10^{21}$, $4 \times 10^{21}$, $5 \times 10^{21}$, $6 \times 10^{21}$, $7 \times 10^{21}$, or about $8 \times 10^{21}$ atoms per cm$^3$ inclusive of all ranges and values therebetween). In one embodiment, the boron concentration in the B-UNCD films can be about $4.8 \times 10^{21}$ atoms per cm$^3$.

In other embodiments, the UNCD film can be a nitrogen doped UNCD (N-UNCD) film having a percentage of nitrogen in the N-UNCD film of about 0.05 atom % to about 0.5 atom % (e.g., about 0.05 atom %, 0.06 atom %, 0.07 atom %, 0.08 atom %, 0.09 atom %, 0.1 atom %, 0.2 atom %, 0.3 atom %, 0.4 atom % or about 0.5 atom % inclusive of all ranges and values therebetween).

While described as being disposed or deposited using a microwave plasma source, any other method can be used to dispose or deposit the doped UNCD film over the diamond substrate. In one embodiment, the UNCD film is disposed or deposited over the sacrificial layer using hot filament chemical vapor deposition (HFCVD).

In particular embodiments, the thickness of the doped UNCD film can be in the range of about 20 nm to about 200 nm (e.g., 20 nm, 40 nm, 60 nm, 80 nm, 100 nm, 120 nm, 140 nm, 160 nm, 180 nm or about 200 nm inclusive of all ranges and values therebetween).

In some embodiments, a masking layer is optionally disposed (e.g., deposited, coated or formed) on the doped UNCD film, at 110. In such embodiments, the masking layer is patterned to define a pattern of electrical contacts in the masking layer, at 112. In some embodiments, masking layer can include an optical photolithography photoresist or an electron beam photoresist (e.g., hydrogen silsesquioxane (HSQ)). In other embodiments, the masking layer can include a metallic layer, for example, a titanium and platinum layer.

In still other embodiments, multiple masking layers can be used. For example, a first masking layer which includes a metal can be disposed (e.g., deposited, coated or formed) on the diamond substrate. A second masking layer, for example the optical or electron beam photoresist can be disposed (e.g., deposited, coated or formed) on the first masking layer. The second masking layer can be patterned using optical lithography or electron beam lithography to define a pattern of the electrical contacts in the second masking layer. The second masking layer is then used as a masking layer for the first masking layer. The first masking layer can, for example be etched using etchants (e.g., acids) to transfer the pattern in the first masking layer. The second masking layer is removed such that the first masking layer can serve as an etch mask for the doped UNCD film. In one embodiment, the first and second masking layer can together be used as an etch mask for the doped UNCD film.

The doped UNCD film is patterned to define UNCD electrical contacts on the diamond substrate, at 114. In some embodiments, the masking layer (e.g., the first and/or second masking layer) can be used as an etch mask for patterning the doped UNCD film to define electrical contacts in the doped UNCD film. The doped UNCD film can be etched using any suitable process such as, for example, oxygen plasma etching, using reactive ion etch process or any other suitable etching process.

The masking layer is removed to leave the diamond substrate with UNCD electrical contacts disposed thereon. In some embodiments, the UNCD film can be patterned to define the electrical contacts without using a masking layer, for example via laser etching.

In this manner B-UNCD or N-UNCD electrical contacts can be formed on a diamond substrate. The doped UNCD electrical contacts have low X-ray absorption, high thermal and electrical conductivity, good adhesion to diamond and excellent thermal properties. In some embodiments, the doped UNCD electrical contacts can have an X-ray absorption of less than about 1%. Thus the doped UNCD electrical contacts are particularly beneficial as electrical contacts for X-ray monitors.

The doped UNCD electrical contacts can have high thermal stability. In some embodiments, the UNCD electrical contacts do not oxidize or otherwise corrode up to a temperature of about 800 degrees Celsius in vacuum. Furthermore, the doped UNCD electrical contacts are resistant to ozone exposure and are resistant to acids. The doped UNCD electrical contacts have sufficient electrical conductivity to allow ampere level currents to pass through while limiting charge injection and persistent current. The UNCD electrical contacts provide devices with linear flux response over a broad range of X-ray wavelengths, for example in the range of 100 eV to 30 keV inclusive of all ranges and values therebetween.

Figure 2:
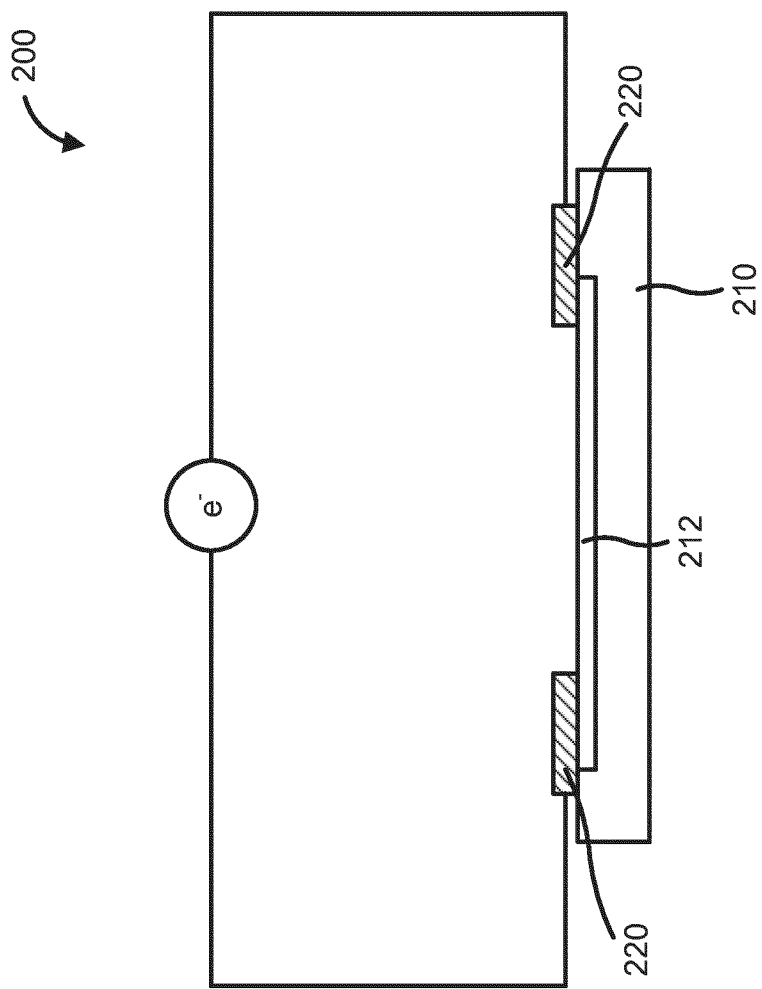
FIG. 2 is a schematic illustration of one embodiment of an electronic device that includes p-doped or n-doped UNCD electrical contacts.

FIG. 2 shows a schematic illustration of a device 200 that includes a diamond substrate 210 and at least one p-doped or n-doped UNCD electrical contact 220. The device 200 can include any electronic device such as, for example p-n junction devices (e.g., solar cells, photocells, diodes, tunnel diodes, zener diodes, LEDs), PIN diodes, transistors, metal oxide semi-conductor field effect transistors (MOSFET), sensors (e.g., Hall effect sensors), integrated circuits, charge coupled devices (CCDs), ROMs, RAMs, etc.

The diamond substrate 210 includes electronic circuitry 212 disposed within the diamond substrate 210. For example, the diamond substrate 210 can be implanted with a p-type dopant (e.g., boron) and/or an n-type dopant (e.g., phosphorous) to form electronic circuits (e.g., a p-n junction) within the diamond substrate 210. The diamond substrate 210 based electronic device can have similar or superior electronic properties to conventional semi-conductor materials (e.g., silicon or germanium) but has higher durability, is resistant to high temperature and chemicals, and provides excellent thermal conductivity.

The device 200 includes at least one p-doped or n-doped UNCD electrical contact 220 disposed or deposited on the diamond substrate 210. The doped UNCD electrical contact 220 is in electrical communication with the electronic circuitry 212 and is configured to provide electrical interface of the electronic circuitry 212 with electronic instrumentation.

In some embodiments, the UNCD electrical contacts 220 can be doped with a p-type dopant. For example, the UNCD electrical contacts 220 can be doped with boron (i.e., B-UNCD) and have a concentration of the boron in the B-UNCD electrical contacts 220 can be in the range of about $1 \times 10^{21}$ atoms per $cm^3$ to about $9 \times 10^{21}$ atoms per $cm^3$ (e.g., about $2 \times 10^{21}$, $3 \times 10^{21}$, $4 \times 10^{21}$, $5 \times 10^{21}$, $6 \times 10^{21}$, $7 \times 10^{21}$, or about $8 \times 10^{21}$ atoms per $cm^3$ inclusive of all ranges and values therebetween). In one embodiment, the boron concentration in the B-UNCD electrical contacts 220 can be about $4.8 \times 10^{21}$ atoms per $cm^3$.

In other embodiments, the UNCD electrical contacts 220 can be doped with an n-type dopant. For example, the UNCD electrical contacts 220 can be doped with nitrogen such that the electrical contacts 220 include N-UNCD. In such embodiments, N-UNCD electrical contacts 220 can have a concentration of nitrogen in the electrical contacts in the range of about 0.05 atom % to about 0.5 atom % (e.g., about 0.05 atom %, 0.06 atom %, 0.07 atom %, 0.08 atom %, 0.09 atom %, 0.1 atom %, 0.2 atom %, 0.3 atom %, 0.4 atom % or about 0.5 atom % inclusive of all ranges and values therebetween).

The doped UNCD electrical contacts 220 can be formed using any suitable method, for example the method 200 or any other method described herein. The doped UNCD electrical contacts 220 can have high thermal stability. In some embodiments, the doped UNCD electrical contacts 220 do not oxidize or otherwise corrode up to a temperature of about 800 degrees Celsius in vacuum. Furthermore, the doped UNCD electrical contacts 220 are resistant to ozone exposure and are resistant to acids. The doped UNCD electrical contacts 220 have sufficient electrical conductivity to allow ampere level currents to pass through while limiting charge injection and persistent current.

Figure 3:
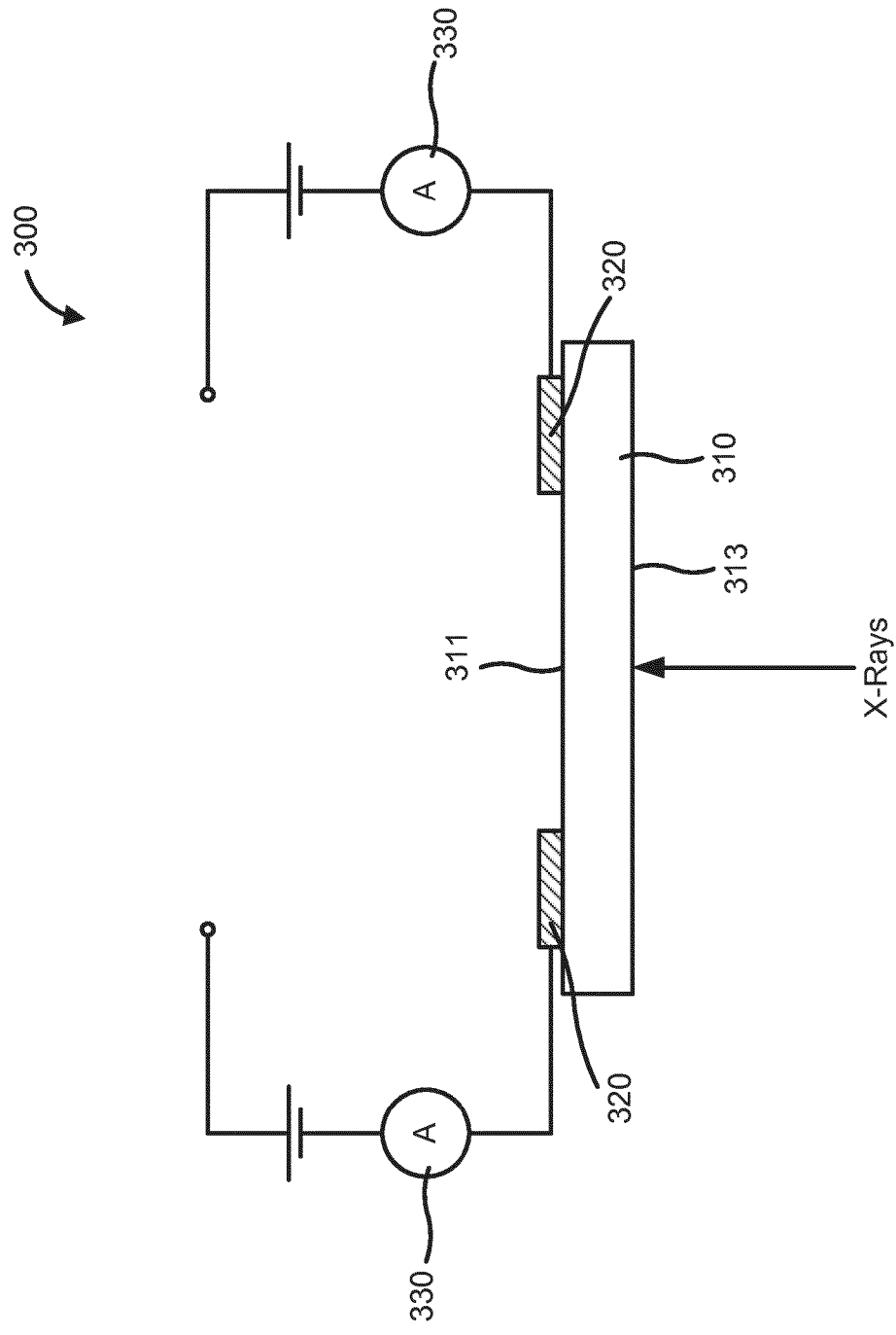
FIG. 3 is a schematic illustration of another embodiment of an X-ray monitor that includes p-doped or n-doped UNCD electrical contacts which have an X-ray absorption of less than about 1%.

FIG. 3 is a schematic illustration of an X-ray monitor 300 that includes a diamond substrate 310 and p-doped or n-doped UNCD electrical contacts 320, according to an embodiment. The X-ray monitor 300 can be used as a flux, position and/or timing monitor for monochromatic and white X-ray beam due to its low absorption, extreme resistance to corrosion and radiation damage, high thermal conductivity and the ability to operate at high temperatures with low leakage.

The diamond substrate 310 can be in the form of a sheet or a plate. The diamond substrate 310 is disposed or positioned in line with and perpendicular to a X-ray beam which can be produced, for example by a synchrotron. The diamond substrate 310 includes a first surface 311 and a second surface 313 opposing the first surface 311. The diamond substrate 310 is disposed or positioned such that the X-rays impinge perpendicularly on the second surface 313. The X-rays generate electron-hole pairs in the entire region of the diamond substrate 310 through which they pass generating photoelectrons.

The plurality of p-doped or n-doped UNCD electrical contacts 320 are disposed or deposited on the first surface 311 of the X-ray monitor 300. The doped UNCD electrical contacts 320 are in electrical communication with the diamond substrate 310 and are configured to provide electrical interface of the diamond substrate 310 with electronic instrumentation 330. The plurality of doped UNCD electrical contacts 320 can have a thickness in the range of about 50 nm to about 200 nm.

In some embodiments, the UNCD electrical contacts 220 can be doped with a p-type dopant. For example, the UNCD electrical contacts 220 can be doped with boron (i.e., B-UNCD). A concentration of the boron in the B-UNCD electrical contacts 320 can be in the range of about $1 \times 10^{21}$ atoms per $cm^3$ to about $9 \times 10^{21}$ atoms per $cm^3$ (e.g., about $2 \times 10^{21}$, $3 \times 10^{21}$, $4 \times 10^{21}$, $5 \times 10^{21}$, $6 \times 10^{21}$, $7 \times 10^{21}$, or about $8 \times 10^{21}$ atoms per $cm^3$ inclusive of all ranges and values therebetween). In one embodiment, the boron concentration in the B-UNCD electrical contacts 320 can be about $4.8 \times 10^{21}$ atoms per $cm^3$.

In other embodiments, the UNCD electrical contacts 320 can be doped with an n-type dopant. For example, the UNCD electrical contacts 320 can be doped with nitrogen such that the electrical contacts 320 include N-UNCD. In such embodiments, N-UNCD electrical contacts 320 can have a concentration of nitrogen in the electrical contacts in the range of about 0.05 atom % to about 0.5 atom % (e.g., about 0.05 atom %, 0.06 atom %, 0.07 atom %, 0.08 atom %, 0.09 atom %, 0.1 atom %, 0.2 atom %, 0.3 atom %, 0.4 atom % or about 0.5 atom % inclusive of all ranges and values therebetween).

The doped UNCD electrical contacts 320 have an X-ray absorption of less than about 1%. The doped UNCD electrical contacts 320 have high thermal and electrical conductivity, good adhesion to diamond and excellent thermal properties. While FIG. 13 shows the doped UNCD electrical contacts 320 as being disposed only the first surface 311, in some embodiments a plurality of doped UNCD electrical contacts 320 can also be disposed on the second surface 313 of the diamond substrate 320.

The doped UNCD electrical contacts 320 can be formed using any suitable method, for example the method 200 or any other method described herein. The doped UNCD electrical contacts 320 can have high thermal stability. In some embodiments, the doped UNCD electrical contacts 320 do not oxidize or otherwise corrode up to a temperature of about 800 degrees Celsius in vacuum. Furthermore, the doped UNCD electrical contacts 320 are resistant to ozone exposure and are resistant to acids. The doped UNCD electrical contacts 320 have sufficient electrical conductivity to allow ampere level currents to pass through while limiting charge injection and persistent current. The doped UNCD electrical contacts 320 provide devices with linear flux response over a broad range of X-ray wavelengths, for example in the range of 100 eV to 30 keV inclusive of all ranges and values therebetween.

As described herein, when the X-ray beam irradiates the diamond substrate 310, electron-hole pairs are generated in the diamond substrate 310. The electronic instrument 330 can be used to exert a positive potential on the doped UNCD electrical contacts 340. The electrons generated in the diamond substrate 310 are communicated via the doped UNCD electrical contacts 320 to the electronic instrumentation 330. The amount of current communicated or any other electronic parameter can be used by the electronic instrumentation to determine a flux and/or position of the X-ray beam by the X-ray monitor.

The following section describes examples of X-ray detectors that includes UNCD contacts. These examples are only for illustrative purposes and are not meant to limit the scope of the concepts described herein.

Experimental Examples

Figure 4:
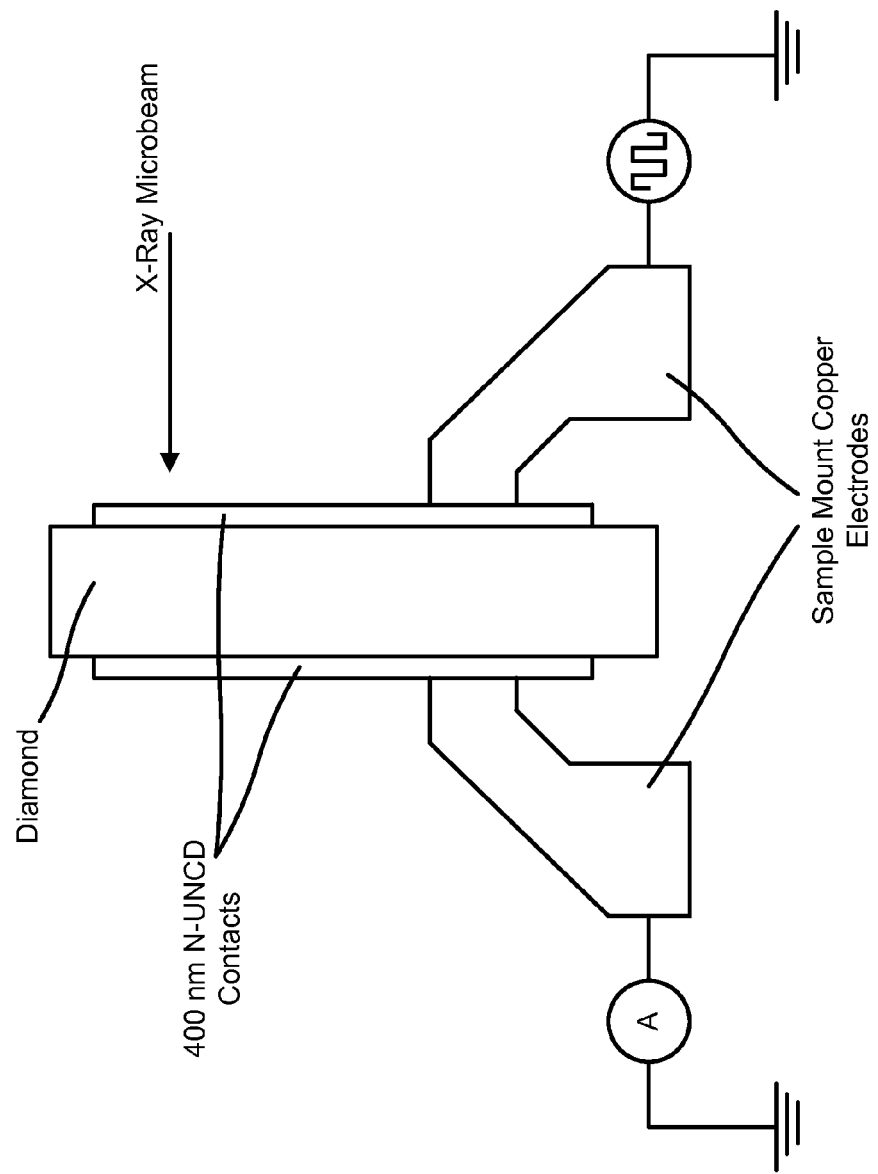
FIG. 4 is a schematic illustrations of an experimental setup for X-ray beam induced current mapping using a diamond detector that includes UNCD electrical contacts.

FIG. 4 shows a schematic illustration of an experimental setup for X-ray beam induced current mapping using a diamond detector that includes N-UNCD electrical contacts. Copper (Cu) mount electrodes are electrically coupled to the N-UNCD contacts to allow interface with detector electronics. The Cu mount electrodes are however disposed on an area of the N-UNCD electrical contacts which is sufficiently distal to a portion of the N-UNCD electrical contacts which is in line with the X-ray beam. The Cu mount electrodes therefore, do not interfere with the X-ray beam detection. The detector is raster scanned through the X-ray microbeam. Pulse bias is provided at low photon energy to reduce trapping effects. The setup is used to measure both the X-ray responsivity and uniformity mapping.

Figure 5:
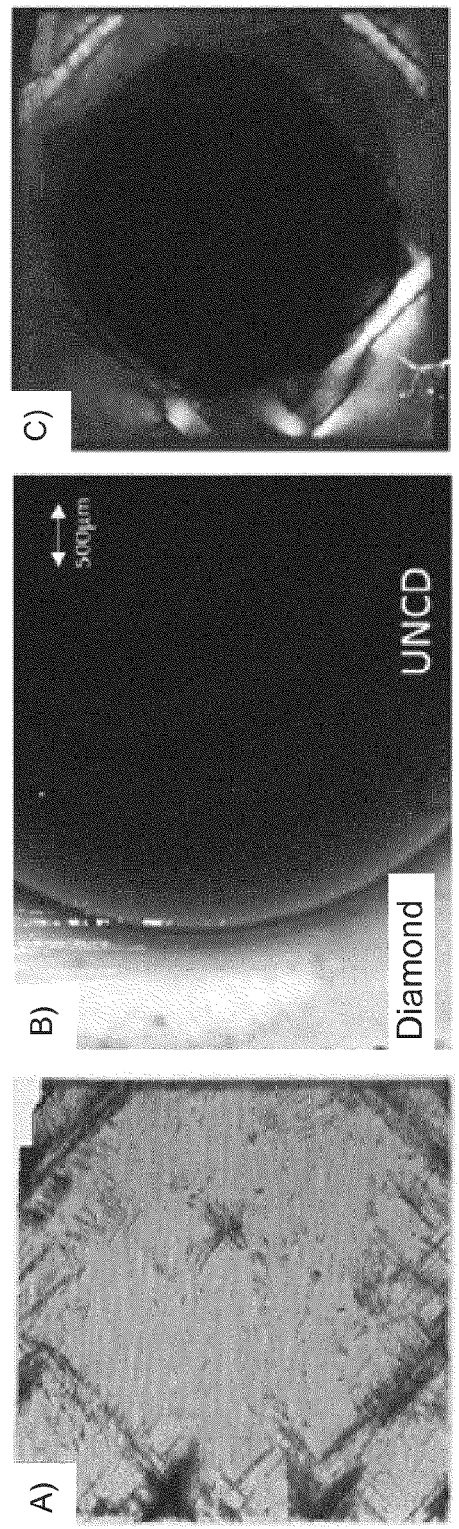
FIG. 5 panel (A) is an X-ray topography image, panel (B) is an image of a n-doped UNCD (N-UNCD) contact grown on diamond, and panel (C) is a birefringence image of the N-UNCD contact of panel (B).

FIG. 5 panel (A) is an X-ray topography image of N-UNCD electrical contact deposited on the diamond substrate which shows an excellent crystalline quality of the N-UNCD electrical contacts. FIG. 5 panel (B) is an optical image of an N-UNCD electrical contact grown on a diamond substrate. FIG. 5 panel (C) is a birefringence image of the N-UNCD coated diamond of FIG. 5 panel (B). The birefringence is clean in the active area of the device which typically results in a device free of hotspots. This is advantageous in a UNCD coated device, as the contacts will not prevent photoconductive gain in the diamond substrate.

Figure 6:
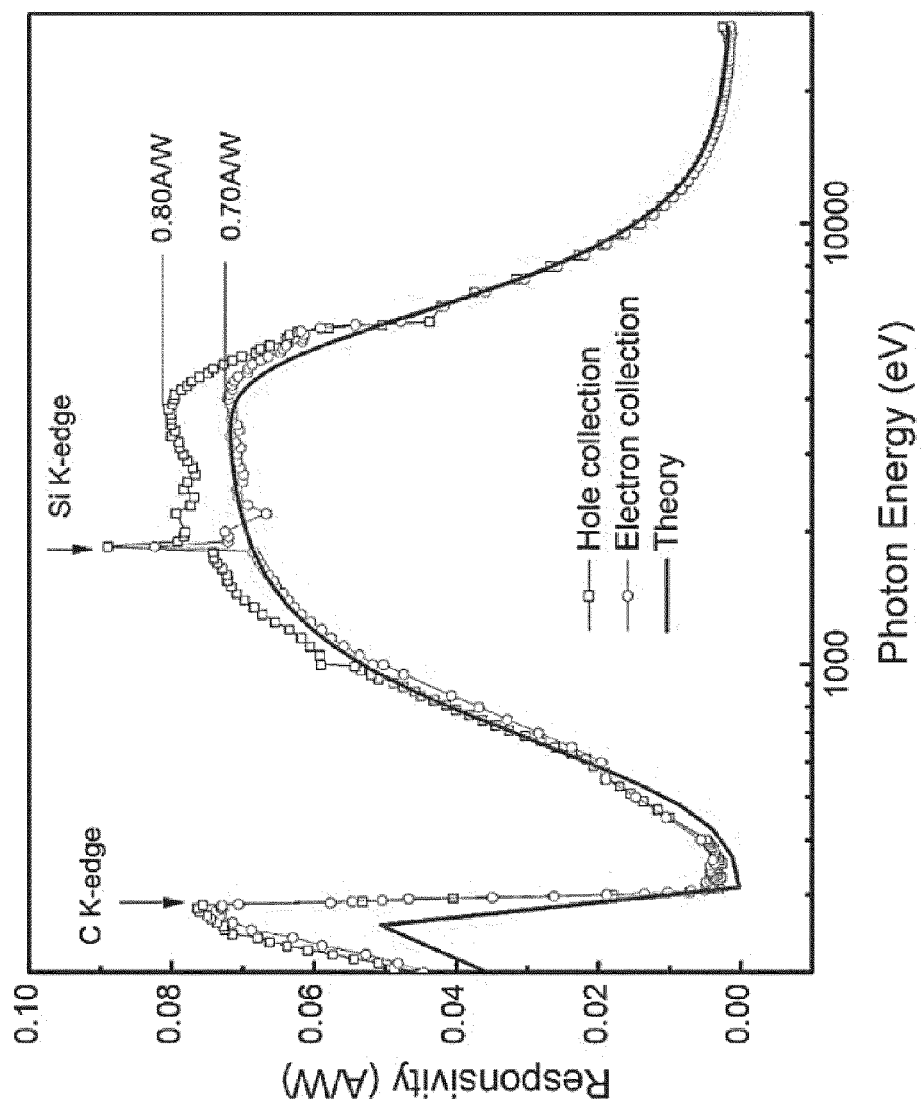
FIG. 6 is a plot of responsivity of 0.3 mm thick diamond H1D10 coated with N-UNCD on both sides as contacts.

FIG. 6 is a plot of responsivity of a 0.3 mm thick diamond (HID 10) coated with N-UNCD diamond on both sides as electrical contacts. The plot shows measured responsivity of electrons and holes as carriers. These responsivity curves are compared to the calculated curves of a model Pt coated X-ray detector (labelled "Theory"). The responsivity of the diamond with N-UNCD contacts matches well with the "Reference" plot demonstrating that the diamond detector with N-UNCD contacts is suitable as a calibrated X-ray detector.

Figure 7:
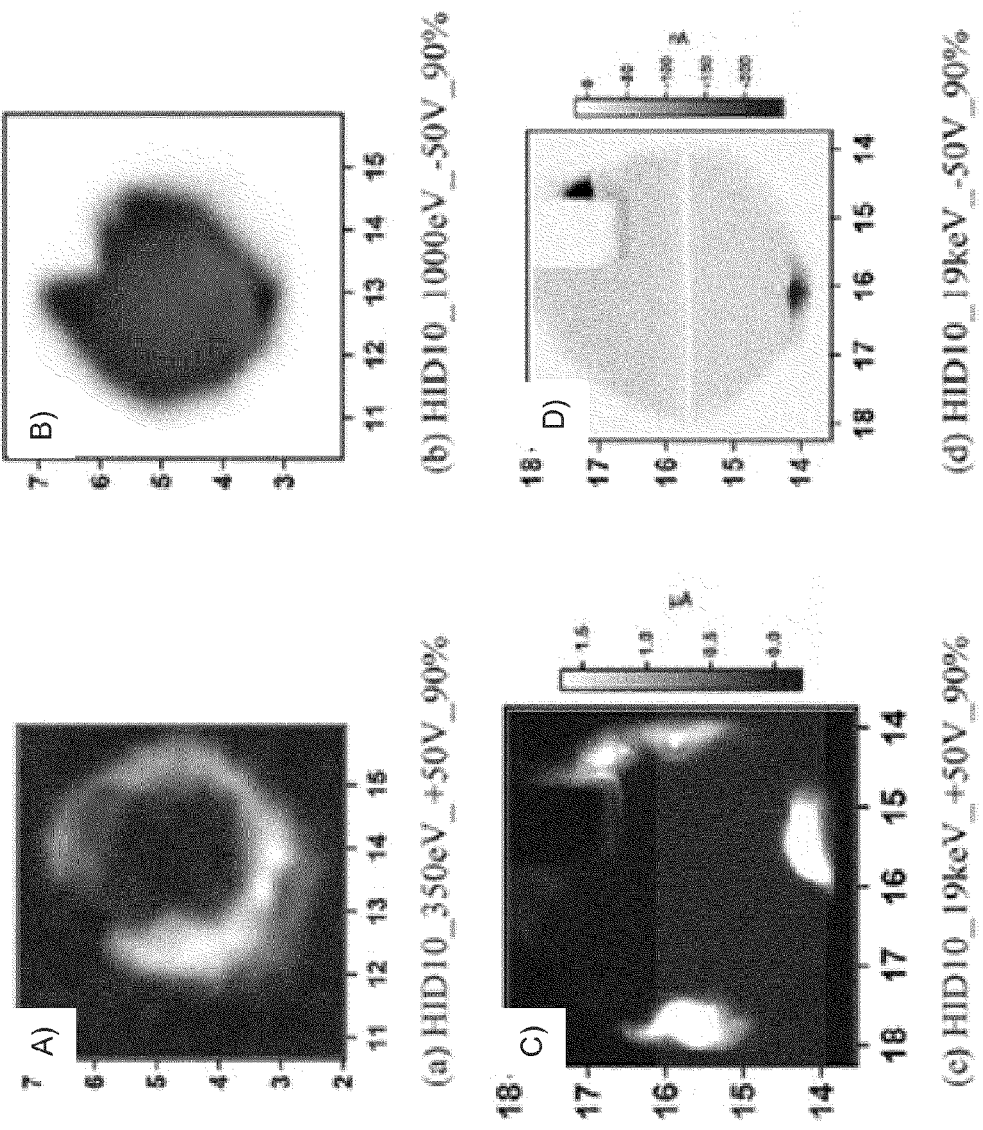
FIG. 7 panels (A-D) are 2D responsivity maps for diamond with N-UNCD grown as contacts taken at: 350 eV and +50 V (panel (A)); 1,000 eV and −50 V (panel (B)); 19 keV and +50 V (panel (C)); and 19 keV and −50 V (panel (D)).

FIG. 7 panels (A-D) are 2D responsivity maps for diamond with N-UNCD grown as contacts taken at: 350 eV and +50 V (panel (A)); 1,000 eV and −50 V (panel (B)); 19 keV and +50 V (panel (C)); and 19 keV and −50 V (panel (D)). The low energy response (panel (A)) shows the effects of the thickness of the UNCD contact with a lower response in the center where the coating is the thickest. Once the photon energy increases such that most of the x-rays are transmitted through the UNCD contact, the active area shows good response uniformity (panels (B-D)).

Figure 8:
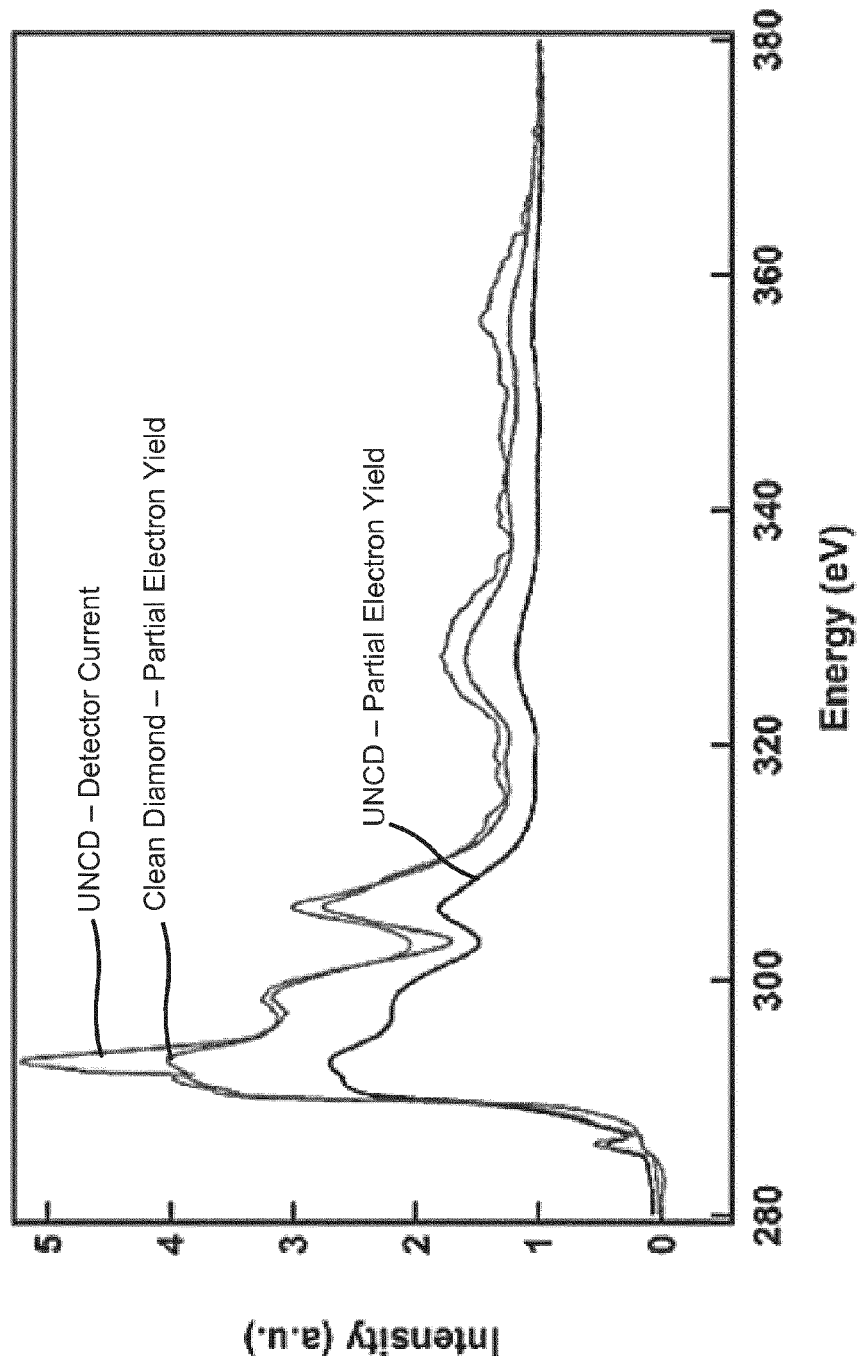
FIG. 8 is a plot of near edge X-ray absorption fine structure (NEXAFS) data taken at a beam line comparing the partial electron yield (PEY) between clean diamond and UNCD contacts.

FIG. 8 is a plot of NEXAFS data taken at an X-ray beamline (Beamline U7A at the national synchrotron light source, Brookhaven National Laboratory) comparing the PEY between clean diamond and the UNCD contacts. The detector current from a diamond X-ray detector with UNCD contacts, converted to a NEXAFS spectrum, is also shown for comparison. These data confirm that the contact is predominately diamond (as opposed to non-diamond carbon) and that the detector has the expected response across the carbon edge.

As used herein, the terms "about" generally means plus or minus 10% of the stated value. For example, about 0.5 would include 0.45 and 0.55, about 10 would include 9 to 11, about 1000 would include 900 to 1100.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Other substitutions, modifications, changes and omissions may also be made in the design, operating conditions and arrangement of the various exemplary embodiments without departing from the scope of the present invention.

What is claimed is:

1. A method of forming electrical contacts on a diamond substrate, comprising:
    producing a plasma ball using a microwave plasma source in the presence of a mixture of gases which include a source of a first p-type dopant or a first n-type dopant;
    disposing the plasma ball at a first distance from the diamond substrate, the diamond substrate maintained at a first temperature;
    maintaining the plasma ball at the first distance from the substrate for a first time;
    disposing an ultrananocrystalline diamond film on the diamond substrate, the ultrananocrystalline diamond film doped with at least one of a second p-type dopant and a second n-type dopant; and
    patterning the ultrananocrystalline film to define ultrananocrystalline diamond electrical contacts on the diamond substrate.

2. The method of claim 1, further comprising:
    disposing a masking layer on the ultrananocrystalline diamond film; and
    patterning the masking layer to define a pattern of the electrical contacts in the masking layer.

3. The method of claim 1, wherein the ultrananocrystalline diamond electrical contacts have an X-ray absorption of less than about 1%.

4. The method of claim 1, wherein the first p-type dopant includes boron.

5. The method of claim 1, wherein the first n-type dopant includes nitrogen.

6. The method of claim 5, wherein the ultrananocrystalline diamond film has a percentage of nitrogen in the range of about 0.05 atom % to about 0.5 atom %.

7. The method of claim 1, wherein the first temperature is in the range of about 350 degrees Celsius to about 950 degrees Celsius.

8. The method of claim 1, wherein the ultrananocrystalline diamond film is patterned using oxygen plasma etching.

9. The method of claim 1, wherein the ultrananocrystalline diamond does not oxidize up to a temperature of about 800 degrees Celsius.

* * * * *